(12) United States Patent
Ogihara

(10) Patent No.: US 12,136,569 B2
(45) Date of Patent: Nov. 5, 2024

(54) SEMICONDUCTOR DEVICE MANUFACTURING METHOD AND SEMICONDUCTOR DEVICE MANUFACTURING SYSTEM

(71) Applicant: FILNEX INC., Tokyo (JP)

(72) Inventor: Mitsuhiko Ogihara, Tokyo (JP)

(73) Assignee: FILNEX INC., Tokyo (JP)

( * ) Notice: Subject to any disclaimer, the term of this patent is extended or adjusted under 35 U.S.C. 154(b) by 336 days.

(21) Appl. No.: 17/581,990

(22) Filed: Jan. 24, 2022

(65) Prior Publication Data

US 2022/0148921 A1    May 12, 2022

Related U.S. Application Data

(63) Continuation of application No. PCT/JP2020/017684, filed on Apr. 24, 2020.

(30) Foreign Application Priority Data

Jul. 29, 2019   (JP) ................................. 2019-138945

(51) Int. Cl.
*H01L 21/78*   (2006.01)
*H01L 21/67*   (2006.01)

(52) U.S. Cl.
CPC .... *H01L 21/7806* (2013.01); *H01L 21/67248* (2013.01); *H01L 21/67259* (2013.01)

(58) Field of Classification Search
CPC .......... H01L 21/7806; H01L 21/67248; H01L 21/67259; H01L 2221/68363; H01L 21/185; H01L 21/2007; H01L 21/67098; H01L 21/6835
See application file for complete search history.

(56) References Cited

U.S. PATENT DOCUMENTS

| 9,312,339 | B2 * | 4/2016 | Werkhoven ....... H01L 21/02002 |
| 2010/0270562 | A1 | 10/2010 | Ogihara |
| 2011/0013865 | A1 * | 1/2011 | Shibata .................. H05K 3/007 216/13 |

(Continued)

FOREIGN PATENT DOCUMENTS

| JP | 2010258352 A | 11/2010 |
| JP | 6431631 B1 | 11/2018 |

*Primary Examiner* — Mohammed Shamsuzzaman
(74) *Attorney, Agent, or Firm* — HAUPTMAN HAM, LLP

(57) ABSTRACT

A method for manufacturing a semiconductor device includes the steps of a first separation process of separating the semiconductor layer from the first substrate by bringing a pick-up substrate into close contact with the semiconductor layer and then moving the pick-up substrate away from the first substrate, pressing of pressing the semiconductor layer that is in close contact with the pick-up substrate to the second substrate, temperature maintenance of maintaining temperatures of contact surfaces of the semiconductor layer and the second substrate at a temperature higher than room temperature while pressing the semiconductor layer onto the second substrate, and a second separation process of separating the semiconductor layer from the pick-up substrate after the temperatures of the contact surfaces are maintained at the temperature higher than room temperature.

13 Claims, 10 Drawing Sheets

(56) References Cited

U.S. PATENT DOCUMENTS

| | | | |
|---|---|---|---|
| 2012/0241919 A1* | 9/2012 | Mitani | H01L 21/6835 |
| | | | 257/E29.022 |
| 2015/0218703 A1* | 8/2015 | Okabe | C25D 5/50 |
| | | | 205/113 |
| 2018/0291498 A1* | 10/2018 | Chan | C23C 14/16 |
| 2019/0334055 A1* | 10/2019 | Chan | C23C 4/06 |
| 2020/0233508 A1* | 7/2020 | Chan | G06F 3/0446 |
| 2020/0348775 A1* | 11/2020 | Chan | G06F 3/041 |
| 2020/0388500 A1 | 12/2020 | Ogihara | |

* cited by examiner

SEMICONDUCTOR DEVICE MANUFACTURING METHOD AND SEMICONDUCTOR DEVICE MANUFACTURING SYSTEM

CROSS-REFERENCE TO RELATED APPLICATIONS

The present application is a continuation application of International Application number PCT/JP2020/017684, filed on Apr. 24, 2020, which claims priority under 35 U.S.C. § 119(a) to Japanese Patent Application No. 2019-138945, filed on Jul. 29, 2019. The contents of these applications are incorporated herein by reference in their entirety.

BACKGROUND OF THE INVENTION

Technical Field

The present disclosure relates to a semiconductor device manufacturing method and a semiconductor device manufacturing system.

Japanese Patent No. 6431631 discloses a method for manufacturing a semiconductor device in which a semiconductor layer formed on a base material substrate is separated from the base material substrate and bonded to a different substrate.

In the method for manufacturing a semiconductor device disclosed in Japanese Patent No. 6431631, the semiconductor layer is brought into close contact with a pick-up substrate in order to separate the semiconductor layer from the base material substrate. Thereafter, in order to bond the semiconductor layer that is in close contact with the pick-up substrate to a destination substrate, a load is applied in a direction in which the semiconductor layer is pressed onto another substrate. There is a problem that if the load applied in the direction in which the semiconductor layer is pressed onto the destination substrate is excessively large, the surface of the pick-up substrate deforms, for example, and the semiconductor layer is bonded to a deviated position on the destination substrate. Therefore, it has been required to reduce the load applied when pressing the semiconductor layer onto the destination substrate.

BRIEF SUMMARY OF THE INVENTION

The present disclosure focuses on this point, and an object thereof is to provide a semiconductor device manufacturing method capable of reducing a load applied when a semiconductor layer is bonded to a destination substrate.

A method for manufacturing a semiconductor device according to the first aspect of the present disclosure is a method for manufacturing a semiconductor device by separating a semiconductor layer formed on a first substrate from the first substrate and bonding the semiconductor layer to a second substrate different from the first substrate, the method includes the steps of a first separation process of separating the semiconductor layer from the first substrate by bringing a pick-up substrate into close contact with the semiconductor layer, pressing of pressing the semiconductor layer that is in close contact with the pick-up substrate to the second substrate, temperature maintenance of maintaining temperatures of contact surfaces of the semiconductor layer and the second substrate at a temperature higher than room temperature while pressing the semiconductor layer onto the second substrate, and a second separation process of separating the semiconductor layer from the pick-up substrate after the temperatures of the contact surfaces are maintained at the temperature higher than room temperature.

A semiconductor device manufacturing system according to the second aspect of the present disclosure includes a first separation part that separates a semiconductor layer from a first substrate by bringing a pick-up substrate into close contact with the semiconductor layer formed on the first substrate and then moving the pick-up substrate away from the first substrate, a press-contact part that presses the semiconductor layer onto a second substrate different from the first substrate by applying a load to the semiconductor layer that is in close contact with the pick-up substrate, a temperature maintaining part that maintains temperatures of contact surfaces of the semiconductor layer and the second substrate at a temperature higher than room temperature while the semiconductor layer is pressed onto the second substrate, and a second separation part that separates the semiconductor layer from the pick-up substrate after the temperature maintaining part maintains the temperatures of the contact surfaces at the temperature higher than room temperature.

DETAILED DESCRIPTION OF THE INVENTION

Figure 1A:
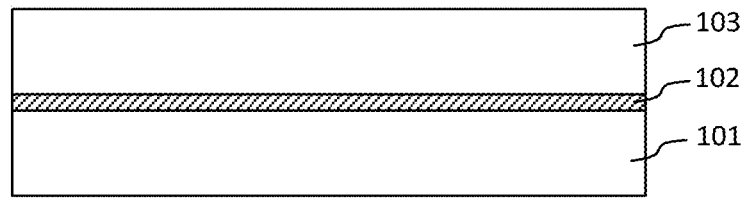
FIGS. 1A to 1D are diagrams for explaining a process of separating a semiconductor layer from a first substrate.

Hereinafter, the present invention will be described through exemplary embodiments of the present invention, but the following exemplary embodiments do not limit the invention according to the claims, and not all of the combinations of features described in the exemplary embodiments are necessarily essential to the solution means of the invention.

[Outline of Semiconductor Device Manufacturing Method]

A semiconductor device manufacturing method according to the present embodiment is a method for manufacturing a semiconductor device by separating a semiconductor layer formed on a first substrate, which is a base material substrate, from the first substrate and bonding the semiconductor layer to a second substrate, which is different from the first substrate. In said manufacturing method, the semiconductor layer crystal-grown on the first substrate is separated from the first substrate, and the load, applied to the semiconductor layer when the separated semiconductor layer is bonded to the second substrate, is reduced, whereby the quality of the semiconductor device can be stabilized and improved.

When the semiconductor layer is bonded to the second substrate without using an adhesive, it has been necessary to increase the load when the semiconductor layer is pressed onto a region to be bonded on the second substrate in order to bring the entire surface of the semiconductor layer into close contact with the region to be bonded on the second substrate if the material of the region to be bonded on the second substrate is hard and difficult to deform, as compared with a case where the material of the region to be bonded is soft and easily deforms. The case where the material is hard and difficult to deform is a case where the elastic modulus is relatively large, and the case where the material is soft and easily deforms is a case where the elastic modulus is relatively small. When the load, applied when the semiconductor layer and the region to be bonded on the second substrate are pressed against each other, is increased to improve adhesion between the semiconductor layer and the region to be bonded on the second substrate, various problems such as described below may occur.

First, by strongly pressing an organic material layer on a pick-up substrate for picking up the semiconductor layer onto the semiconductor layer, the following problems may occur: (1) deformation of the pick-up substrate (for example, plastic deformation of the organic material layer, or destruction of the organic material layer), (2) fixing of the organic material layer to the semiconductor layer, and (3) fixing of the organic material layer to the second substrate outside the semiconductor layer.

When the organic material layer on the pick-up substrate deforms, a position on the second substrate at which the semiconductor layer is to be bonded is deviated. Further, if the organic material layer is fixed to the semiconductor layer and the force at which the organic material layer adheres to the semiconductor layer is larger than the force at which the semiconductor layer bonds to the second substrate, the bonding of the semiconductor layer to the second substrate is hindered. Furthermore, if the organic material layer is fixed to the second substrate outside the semiconductor layer, there would be a problem such that the organic material layer attached to the second substrate becomes a contaminant on the second substrate, or the pick-up substrate or the organic material layer becomes less likely to be separated from the second substrate.

In addition, a surface roughness of the surface of the region to be bonded may be large depending on the material or processing condition of the region to be bonded. Moreover, the surface roughness of the region to be bonded may increase even if a structure of a lower portion of the region to be bonded is uneven. In such a case, there is a problem that the load, applied when the semiconductor layer is pressed onto the region to be bonded on the second substrate, needs to be increased in order to bring the entire surface of the semiconductor layer into close contact with the region to be bonded on the second substrate, as compared with a case where the surface roughness of the region to be bonded is small.

It should be noted that the case where the surface roughness is large is, for example, a case where the root mean square (rms) surface roughness measured in a region of 5 μm×5 μm exceeds 1 nm, or the case where the peak-to-valley (P-V) value in the surface roughness measurement exceeds 10 nm. The case where the surface roughness is small is, for example, a case where the rms surface roughness measured in the region of 5 μm×5 μm is 1 nm or less, or a case where the P-V value is 10 nm or less. Even when the surface roughness of the region to be bonded is large, the same problem as in the case where the material of the region to be bonded on the second substrate is hard and difficult to deform occurs.

Further, in order to increase the load applied when the semiconductor layer having a large area is pressed onto the region to be bonded of the second substrate, the scale of an apparatus for applying the load must be increased, which results in a problem that a cost for manufacturing the semiconductor device is increased.

In order to solve these problems, in the semiconductor device manufacturing method according to the present embodiment, first, a first separation process of separating the semiconductor layer from the first substrate by bringing the pick-up substrate into close contact with the semiconductor layer and then moving the pick-up substrate away from the first substrate is performed. Subsequently, a pressing process of pressing the semiconductor layer that is in close contact with the pick-up substrate onto the second substrate is performed. While performing the process of pressing the semiconductor layer onto the second substrate, a temperature maintaining process of maintaining contact surfaces of the semiconductor layer and the second substrate at a temperature (for example, 25° C.) higher than room temperature is performed. And then, a second separation process of separating the semiconductor layer from the pick-up substrate is performed after contact surfaces have been maintained at the temperature higher than room temperature.

The state in which the pressing process is performed is a state in which the load is applied between the semiconductor layer and the second substrate and said load causes the semiconductor layer to be at least partially in contact with the surface of the region to be bonded on the second substrate. In the process of maintaining the contact surfaces at the temperature higher than room temperature, for example, at least one of the second substrate and the pick-up substrate is heated such that the temperatures of the contact surfaces are between 80° C. and 150° C. It is considered that heating at least one of the second substrate and the pick-up substrate causes (i) molecules that weaken the bonding force existing on the bonding surfaces of the second substrate or the semiconductor layer on the pick-up substrate or (ii) molecules that have little to do with bonding, to desorb from the surfaces of the regions to be bonded, whereby the semiconductor layer is easily bonded to the second substrate. As a result, by executing such a process, the load applied to the semiconductor layer when the semiconductor layer is bonded to the second substrate can be made smaller than in the conventional method, thus solving at least one of the various problems mentioned above. The present manufacturing method will be described in detail below.

[Example of Semiconductor Device Manufacturing Method]
(Separation of Semiconductor Layer From First Substrate)

Figure 1B:
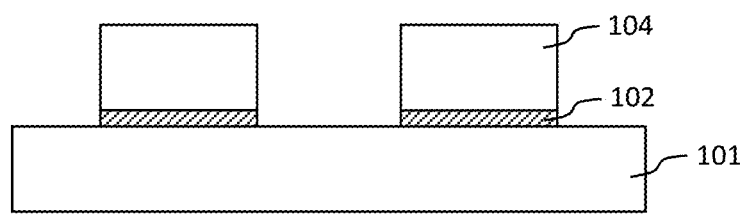

FIGS. 1A and 1B are diagrams for explaining a process of separating the semiconductor layer from the first substrate.

First, as shown in FIG. 1A, a sacrificial layer 102 and a semiconductor layer 103 are formed on a first substrate 101 which is a base material substrate. The first substrate 101 is, for example, (a) a semiconductor substrate such as a Si substrate, a GaAs substrate, a GaN substrate, an AlN substrate, an InP substrate, or a SiC substrate, or (b) an oxide substrate such as an $Al_2O_3$ substrate, a $Ga_2O_3$ substrate, or a ZnO substrate.

The sacrificial layer 102 is a layer whose etching rate is greater than etching rates of the first substrate 101 and the semiconductor layer 103 for a predetermined etchant. The sacrificial layer 102 is a layer that can be selectively etched from the first substrate 101 and the semiconductor layer 103 through an etching process using the predetermined etchant.

The semiconductor layer 103 is a semiconductor layer having a structure for forming a predetermined semiconductor device. The semiconductor layer 103 has a single layer structure or a laminated structure including a plurality of different semiconductor layers, for example.

Next, as shown in FIG. 1B, the sacrificial layer 102 and the semiconductor layer 103, in the state shown in FIG. 1A, are processed to form semiconductor layer islands 104. When the semiconductor layer islands 104 are formed, portions of the sacrificial layer 102 and the semiconductor layer 103 are removed to a depth such that the sacrificial layer 102 is exposed at lower portions of the side surfaces of a plurality of semiconductor layer islands 104.

Figure 1C:
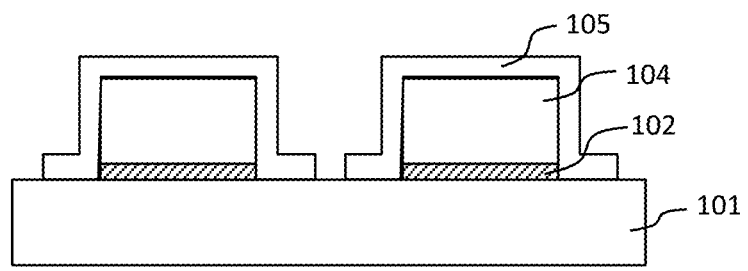

Next, as shown in FIG. 1C, a fixing layer 105 is formed in a region from the semiconductor layer island 104 to exposed surfaces of the first substrate 101. The fixing layer 105 functions to secure the semiconductor layer 103 to the first substrate 101 in a process of etching away the sacrificial layer 102. The fixing layer 105 is a material that is resistant to an etching means for removing the sacrificial layer 102, and an inorganic material thin film or an organic material thin film may be used.

The material of the fixing layer 105 is selected depending on the etching means or the etchant to be used, and a photosensitive organic material (resist) may be used, for example. In this case, the fixing layer 105 can be formed by performing an exposure and development process after the resist is applied. The fixing layer 105 may cover the entire area of the surfaces of the semiconductor layer islands 104, or may cover partial areas of the islands 104.

Figure 1D:
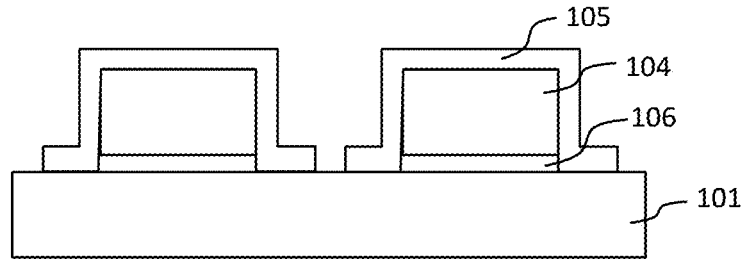

Next, as shown in FIG. 1D, the sacrificial layer 102 is etched with a predetermined etching means, for example, wet etching using a predetermined etchant to form voids 106 between the semiconductor layer islands 104 and the first substrate 101.

Figure 1E:
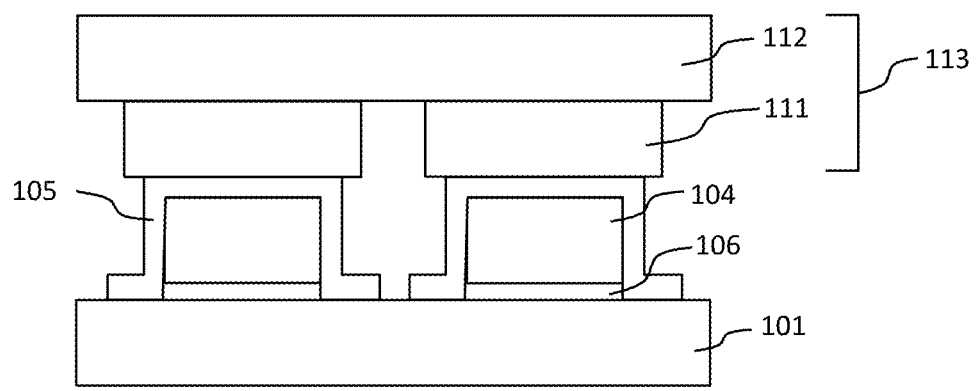
FIGS. 1E and 1F are diagrams for explaining a process of separating the semiconductor layer from the first substrate.

Next, a first separation process of separating the plurality of semiconductor layer islands 104 from the first substrate 101 is performed. First, as shown in FIG. 1E, a pick-up substrate 113 is brought into close contact with the semiconductor layer islands 104. The pick-up substrate 113 includes an organic material layer 111 and a substrate 112. That is, the organic material layer 111 is provided on a surface of the pick-up substrate 113 that is pressed onto the semiconductor layer islands 104. The material of the substrate 112 is arbitrary, and is metal, ceramic, or resin, for example. After the organic material layer 111 is connected to the semiconductor layer islands 104 or the fixing layer 105, the pick-up substrate 113 is moved in a direction such that the fixing layer 105 in the vicinity of the voids 106 is cut (for example, in a direction away from the first substrate 101).

Figure 1F:
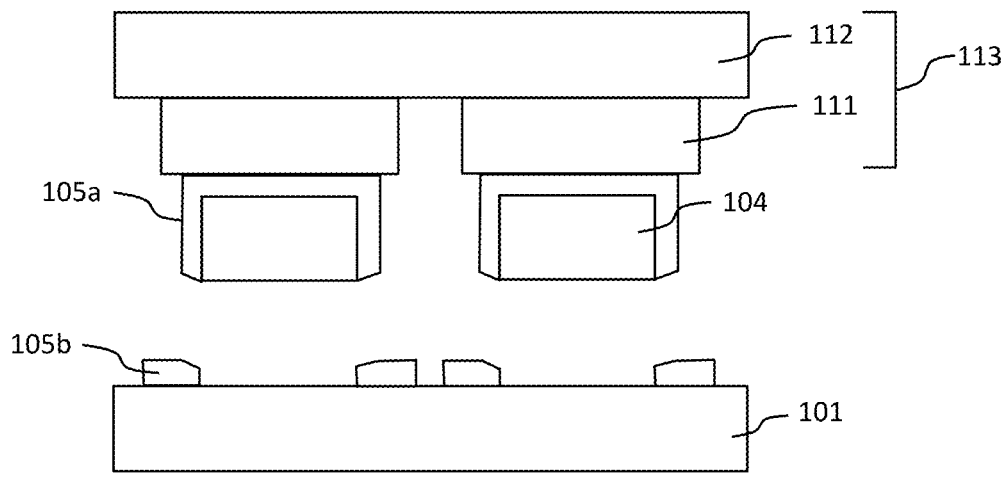

As a result, as shown in FIG. 1F, the semiconductor layer islands 104 can be separated from the first substrate 101 in a state where the semiconductor layer islands 104 are in close contact with the organic material layer 111 on the pick-up substrate 113. In FIG. 1F, the fixing layer 105 is cut and separated into portions 105a of the fixing layer 105 lifted together with the semiconductor layer islands 104 and portions 105b remaining on the first substrate.

A photosensitive organic material can be used as the organic material layer 111, for example. In this case, a pattern of the organic material layer 111 corresponding to the pattern of the semiconductor layer islands 104 can be formed by applying a liquid photosensitive organic material or attaching a sheet-like photosensitive organic material onto the substrate 112, and using a standard exposure and development process. It should be noted that the organic material layer 111 may be formed by attaching, to the substrate 112, the sheet-like organic material previously formed on another substrate or the like, or an organic material piece obtained by dividing the sheet-like organic material into pieces.

In addition, an organic material sheet including a bump pattern corresponding to the pattern of the semiconductor layer islands 104 may be prepared by using a mold and attached to the substrate 112, or the organic material sheet including the bump pattern may be used as the substrate 112. Alternatively, an organic material piece prepared by an appropriate means may be attached to the semiconductor layer islands 104 without using the substrate 112, and then the semiconductor layer islands 104 may be separated from the first substrate 101 by lifting the organic material piece by an appropriate means. A configuration of the pick-up substrate 113 and a method for separating the semiconductor layer islands 104 from the first substrate 101 can be changed as appropriate.

(Bonding Semiconductor Layer to Second Substrate)

Figure 2A:
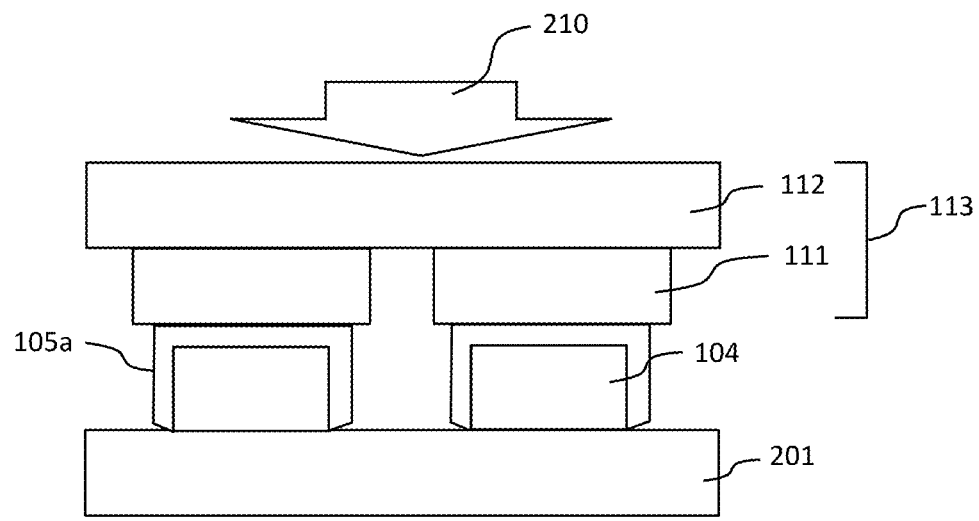
FIGS. 2A and 2B are diagrams for explaining a process of bonding a semiconductor layer island to a second substrate.
Figure 2B:
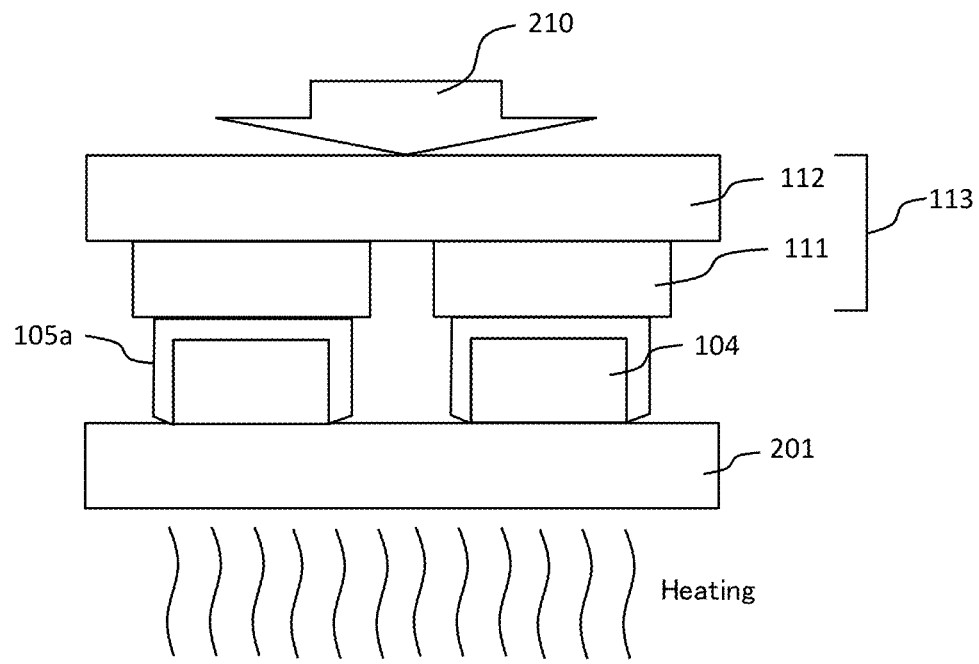

The semiconductor layer islands 104 are separated from the first substrate 101 with the above processes, and then the semiconductor layer islands 104 are bonded to a second substrate 201. FIGS. 2A and 2B are diagrams for explaining a process of bonding the semiconductor layer islands 104 to the second substrate 201. An inorganic material layer, the organic material layer, a metal material layer, the semiconductor layer, or a laminated structure including these materials can be provided in the region to be bonded on the second substrate 201. Before the semiconductor layer islands 104 are bonded to the second substrate 201, a process of surface treatment such as plasma treatment or chemical treatment using a chemical solution on the regions to be bonded of the semiconductor layer islands 104 and the second substrate 201 may be performed.

For example, the region to be bonded on the second substrate 201 can be made of a material that is hard and difficult to deform (material having a large elastic modulus), for example. The material that is hard and difficult to deform is a material having an elastic modulus greater than 5 GPa, for example. As the material having an elastic modulus greater than 5 GPa, the following materials may be used: (a) an oxide such as silicon oxide, aluminum oxide, zinc oxide, and gallium oxide, (b) a nitride such as silicon nitride, gallium nitride, aluminum nitride, and titanium nitride, (c) a carbide such as diamond, diamond-like carbon, and silicon carbide, (d) a metal such as aluminum, copper, gold, platinum, nickel, titanium, and germanium, or (d) an alloy material. As a semiconductor material having an elastic modulus greater than 5 GPa, the following materials may be used: (a) a single element semiconductor material such as Si and Ge, or (b) a compound semiconductor material such as GaAs, GaN, InP, and SiC. These inorganic materials, metal materials, and semiconductor materials may be bulk materials constituting the second substrate 201, and may be thick film materials or thin film materials formed on the second substrate 201.

The surface of the region to be bonded of the second substrate may be, for example, a rough surface having an rms surface roughness of more than 1 nm measured in the region of 5 μm×5 μm, or a rough surface for which the P-V value of a surface roughness measurement is more than 10 nm. A surface with a large surface roughness for which the P-V value of, for example, more than 10 nm may be generated, for example, when a layer having unevenness exists in a lower layer, or when unevenness such as a hillock or a scratch is generated on a material surface during the material formation or processing. The unevenness such as the hillock or the scratch may be generated on the material surface during the material formation or processing, for example, when forming a metal thin film layer of Al, an alloy containing Al, an alloy containing Au, or the like, when annealing the metal thin film layer, or when performing precision processing including mechanical processing such as precision polishing or etching processing with a chemical solution.

A process of pressing the semiconductor layer islands 104 onto the second substrate 201 will be described in detail with reference to FIGS. 2A and 2B below. First, as shown in FIG. 2A, the semiconductor layer islands 104 separated from the first substrate 101 are placed on the second substrate 201, and then a pressing process is performed in which a load 210 is applied from above the pick-up substrate 113 toward the second substrate 201.

In this pressing process, a load is applied that is smaller than a load required for pressing the semiconductor layer islands 104 onto the region to be bonded of the second substrate 201 at room temperature to make the bonding possible. In the pressing process, it is desirable to apply a load that is, for example, smaller than a load that causes the organic material layer 111 of the pick-up substrate 113 to be plastically deformed.

As shown in FIG. 2B, while the semiconductor layer islands 104 are pressed onto the region to be bonded of the second substrate 201 with the load 210, a temperature maintaining process is performed in which temperatures of the surfaces where the semiconductor layer islands 104 are in contact with the second substrate 201 are maintained at a temperature higher than room temperature. For example, the temperature of one or both of the second substrate 201 and the pick-up substrate 113 is maintained at a temperature higher than room temperature. A time during which the temperature is maintained in a heated state can be appropriately determined depending on the material or state of the bonding surfaces. As an example, in the temperature maintaining process, a heating temperature is maintained for one second or more (for example, 60 seconds).

In order to maintain the temperatures of the contact surfaces of the semiconductor layer islands 104 and the second substrate 201 at the temperature higher than room temperature, regions including at least regions corresponding to the plurality of semiconductor layer islands 104 that are in close contact with the pick-up substrate 113 are heated. For example, a process of heating positions of the semiconductor layer islands 104 on at least one of the second substrate 201 and the pick-up substrate 113 is performed while the pressing process is performed.

The heating of at least one of the second substrate 201 and the pick-up substrate 113 may be started after the start of the pressing process, or the heating may be started before the start of the pressing process. By starting the heating before the start of the pressing process, the time required for bonding can be shortened because the temperatures of the bonding surfaces are higher than room temperature at the time when the pressing process is started.

According to an experiment done by the present inventors, a peripheral temperature of the second substrate 201 at the time of pressing is preferably in a range between 80° C. and 150° C. If the temperature is lower than 80° C., it is insufficient to obtain the effect of bonding, or it takes a long time to complete the bonding. By maintaining the heating temperature between about 80° C. and 100° C., the semiconductor layer islands 104 can be favorably bonded to the second substrate 201 in a short time.

If the temperature exceeds 150° C., the organic material used in the process (the fixing layer 105, the organic material layer 111 on the pick-up substrate) may deteriorate. When the heating is performed at a temperature exceeding 150° C., the organic material layer 111 on the pick-up substrate 113 may be fixed to the semiconductor layer islands 104, and the organic material layer 111 will not be removed. When the organic material layer 111 is fixed to the semiconductor layer islands 104, portions of the semiconductor layer islands 104 are separated from the second substrate 201 in the process of separating the pick-up substrate 113 from the second substrate 201.

Further, even when the semiconductor layer islands 104 are bonded to the second substrate 201, the organic material layer 111 sometimes remains on the semiconductor layer islands 104. If the organic material layer 111 remains on the semiconductor layer islands 104, the organic material layer 111 hinders the subsequent process for manufacturing the semiconductor device. Therefore, heating at a temperature exceeding 150° C. is not desirable. From the viewpoint of deterioration and remaining of the organic material, the heating temperature should be adjusted especially not to exceed 200° C.

Figure 2C:
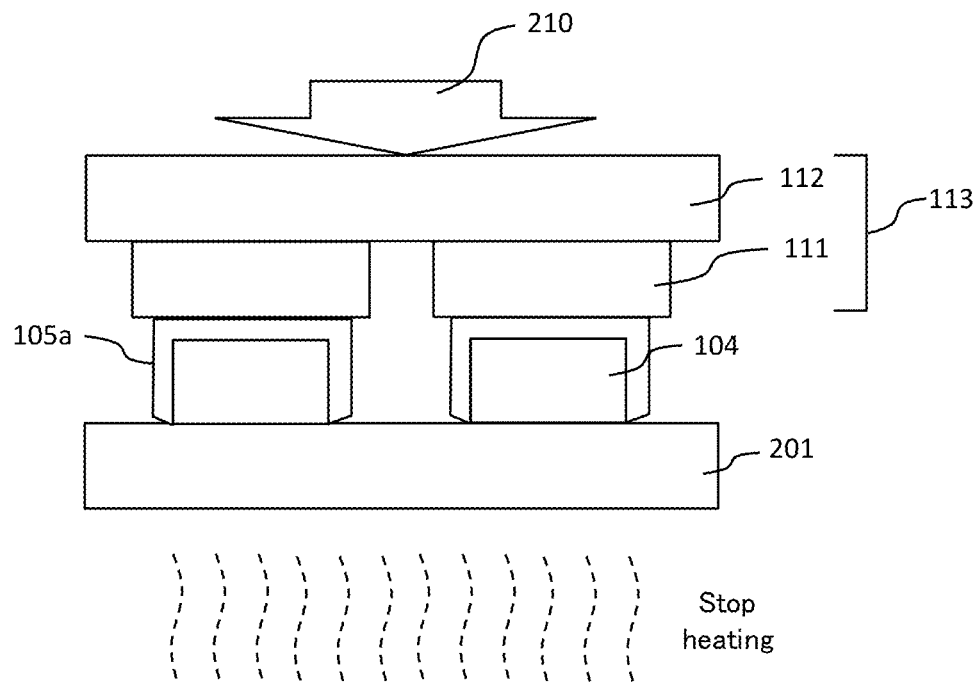
FIGS. 2C and 2D are diagrams for explaining a process of bonding the semiconductor layer island to the second substrate.
Figure 2D:
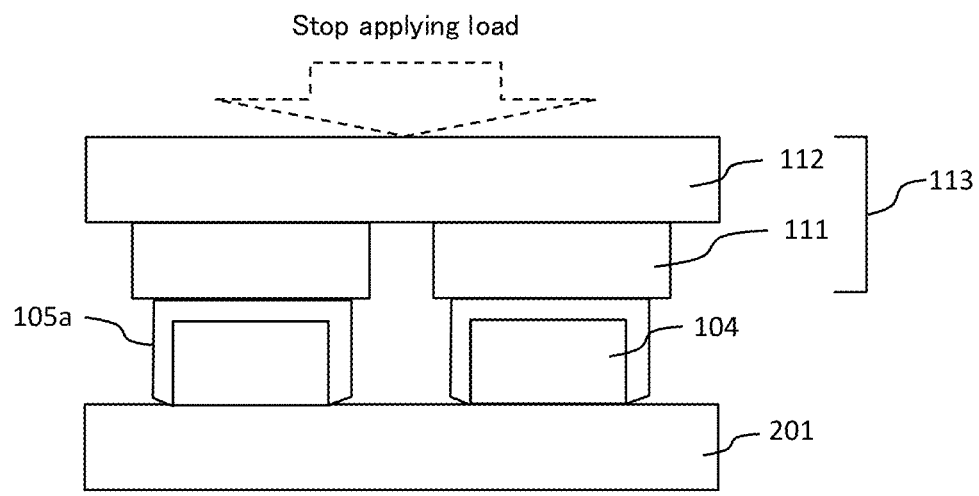

Subsequently, as shown in FIG. 2C, the heating is stopped after the pressing is performed while heating for a predetermined time. Further, as shown in FIG. 2D, the application of the load is stopped in the second separation process of separating the semiconductor layer islands 104 from the pick-up substrate 113. After the heating is stopped, a cooling process may be performed as appropriate. A relationship between the timing of stopping the heating and the timing of stopping the application of the load is arbitrary, and the heating temperature may be lowered while the load is applied for the pressing. In addition, the application of the load may be stopped while heating.

(Process After Bonding)

In the second separation process, a method for separating the semiconductor layer islands 104 from the pick-up substrate 113 after stopping the application of the load to the pick-up substrate 113 is arbitrary, but for example, the following four methods are conceivable.

(1) Chemically dissolving the organic material layer 111
(2) Mechanically separating the organic material layer 111 and the substrate 112 of the pick-up substrate 113 from each other, and then chemically dissolving the organic material layer 111 adhered to the surfaces of the semiconductor layer islands 104

(3) Mechanically separating the organic material layer 111 and the substrate 112 of the pick-up substrate 113 from each other, and then mechanically separating the organic material layer 111 adhered to the surfaces of the semiconductor layer islands 104

(4) Mechanically separating the organic material layer 111 from the semiconductor layer islands 104

The method of chemically dissolving is a method of selectively etching the organic material layer 111, for example. The method of mechanically separating is a method of pulling the pick-up substrate 113 or stopping the force of suction on the semiconductor layer islands 104, for example.

Figure 3A:
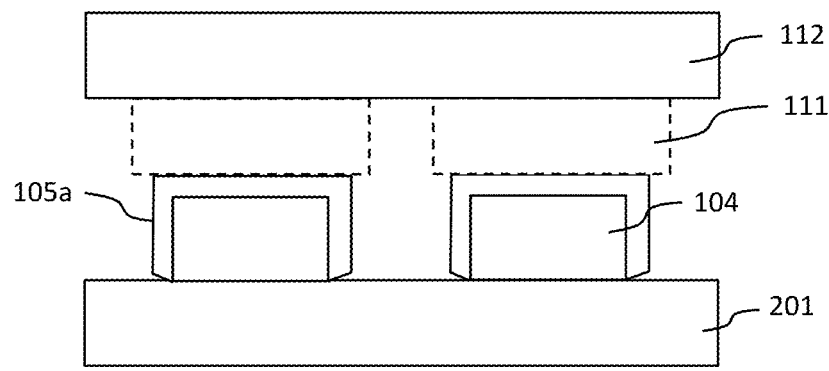
FIGS. 3A to 3C are diagrams for explaining a process after bonding the semiconductor layer islands to the second substrate.
Figure 3B:
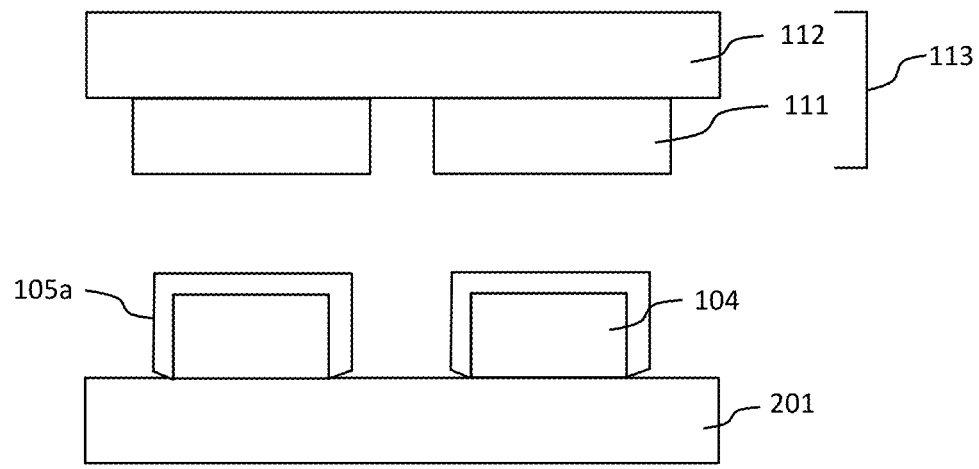

FIG. 3 is a diagram for explaining a process after bonding the semiconductor layer islands 104 to the second substrate 201. After the semiconductor layer islands 104 are bonded to the second substrate 201, the pick-up substrate 113 is separated from the semiconductor layer islands 104 bonded to the region to be bonded on the second substrate 201, as shown in FIGS. 3A and 3B.

As described above, the means for separating the pick-up substrate 113 from the semiconductor layer islands 104 is arbitrary, but for example, the pick-up substrate 113 can be separated from the semiconductor layer islands 104 by dissolving the organic material layer 111 on the substrate 112 connected to the semiconductor layer islands 104 or the fixing layer 105. Broken lines in FIG. 3A schematically show that the organic material layer 111 was dissolved and removed. The organic material layer 111 may be mechanically separated from the semiconductor layer islands 104 by lifting up the pick-up substrate 113 without dissolving the organic material layer 111.

Figure 3C:
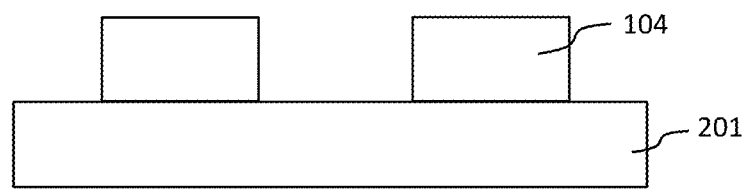

After the pick-up substrate 113 is separated from the semiconductor layer islands 104, the fixing layer 105a on the semiconductor layer islands 104 may be removed as necessary. When the fixing layer 105a is formed of the organic material (resist material), the fixing layer 105a can be removed using an organic solvent, a resist stripping solution, or the like, as shown in FIG. 3C. Thereafter, a predetermined device forming process such as forming an interlayer insulating film and wiring is performed as appropriate. Before performing the predetermined device forming process, an annealing process suitable for the device forming process may be performed. Since the unnecessary organic material has already been removed, the annealing process may be performed at a temperature exceeding 150° C.

[Semiconductor Device Manufacturing System]

Figure 4:
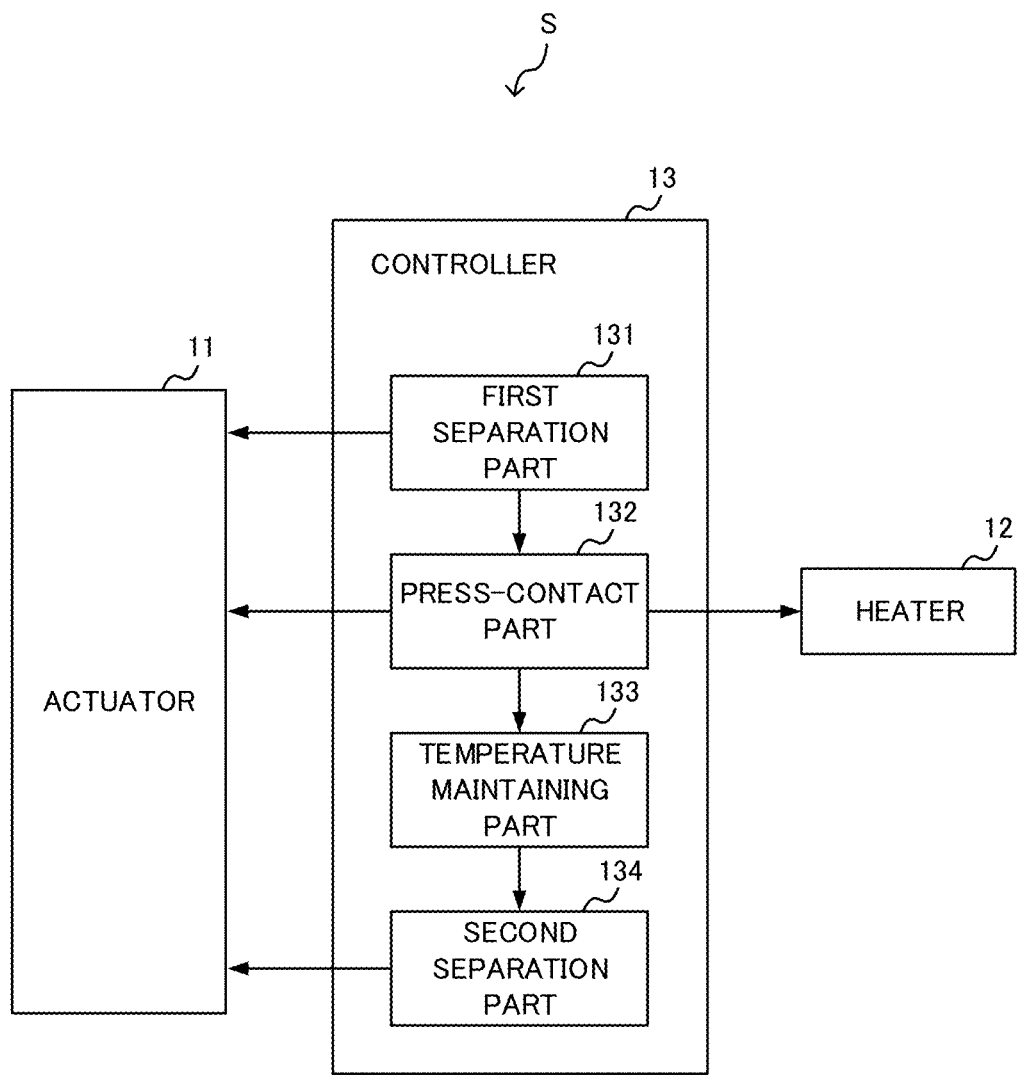
FIG. 4 shows a configuration of a manufacturing system for carrying out a semiconductor device manufacturing method.

FIG. 4 shows a configuration of a manufacturing system S for carrying out the semiconductor device manufacturing method according to the present embodiment. Each unit of the manufacturing system S shown in FIG. 4 may be realized by one device or may be realized by combining a plurality of devices.

The manufacturing system S includes an actuator 11, a heater 12, and a controller 13. The controller 13 is a computer that controls the actuator 11 and the heater 12 by executing a program, for example. The controller 13 includes a processor that functions as a first separation part 131, a press-contact part 132, a temperature maintaining part 133, and a second separation part 134 by executing a program.

The first separation part 131 separates the semiconductor layer islands 104 from the first substrate 101 by bringing the pick-up substrate 113 into close contact with the semiconductor layer islands 104. The first separation part 131 separates the semiconductor layer islands 104 from the first substrate 101, for example, by controlling the actuator 11 to pull up the pick-up substrate 113 after the pick-up substrate 113 is brought into close contact with the semiconductor layer islands 104.

The press-contact part 132 applies a load to the semiconductor layer islands 104 that are in close contact with the pick-up substrate 113 to press the semiconductor layer islands 104 onto the second substrate 201. The press-contact part 132 controls, for example, the actuator 11 to move the pick-up substrate 113 having the semiconductor layer islands 104 in close contact to a location above the second substrate 201, and then lowers the pick-up substrate 113 toward the second substrate 201. Thereafter, the press-contact part 132 operates the actuator 11 such that a predetermined load is applied to the pick-up substrate 113. The press-contact part 132 may apply, to the pick-up substrate 113, a load with a magnitude based on at least one of the material, thickness, or surface state of the semiconductor layer islands 104, or the material of the pick-up substrate 113.

The temperature maintaining part 133 controls the heater 12 such that the temperatures of the contact surfaces of the semiconductor layer islands 104 and the second substrate 201 are maintained at a predetermined temperature higher than room temperature while the semiconductor layer islands 104 are pressed onto the second substrate 201. The heater 12 functions as a heating source, and can be provided to the second substrate 201, the pick-up substrate 113, or both the second substrate 201 and the pick-up substrate 113. The temperature maintaining part 133 may acquire information regarding at least one of the materials, thicknesses, or surface states of the second substrate 201 and the semiconductor layer islands 104, and determine a heating amount of the heater 12 on the basis of the acquired information.

For example, if the second substrate 201 and the semiconductor layer islands 104 are made of materials that have difficulty bonding with each other, the temperature maintaining part 133 increases the heating amount more than a case where the second substrate 201 and the semiconductor layer islands 104 are made of materials that easily bond with each other. Further, if the thickness of the second substrate 201 or the semiconductor layer islands 104 is large, for example, the temperature maintaining part 133 increases the heating amount more than the case where the thickness of the second substrate 201 or the semiconductor layer islands 104 is small.

In addition, if the amount of unevenness on the surface of the second substrate 201 or the semiconductor layer islands 104 is large, for example, the temperature maintaining part 133 increases the heating amount more than in a case where the amount of unevenness is small. The amount of unevenness is represented, for example, by a distance between the most protruding part and the most recessed part on the surface of the island 104 in the direction orthogonal to the surface of the island 104. By having the temperature maintaining part 133 that operates in this manner, the manufacturing system S can shorten the bonding time even if the second substrate 201 and the semiconductor layer islands 104 have difficulty bonding with each other.

The second separation part 134 separates the semiconductor layer islands 104 from the pick-up substrate 113 after the temperature maintaining part 133 maintains the temperatures of the contact surfaces of the semiconductor layer islands 104 and the second substrate 201 at the temperature higher than room temperature. The second separation part 134 separates the semiconductor layer islands 104 from the pick-up substrate 113 in a state where the semiconductor layer islands 104 are bonded to the second substrate 201 by moving the actuator 11 upward, for example.

RESULTS OF EXPERIMENTS

First Experiment

The inventors have found through experiments that the semiconductor layer islands 104 can be favorably bonded to the second substrate 201 by the process of pressing the semiconductor layer islands 104 onto the second substrate 201 with a low load while heating. In the first experiment, a plurality of materials having different elastic moduli were used in the region to be bonded on the second substrate 201, and bonding states (that is, bonding yields) were compared between (a) the case where the heating process was performed while the semiconductor layer islands 104 was pressed onto the region to be bonded of the second substrate 201 and (b) the case where no heating process was performed during the pressing. As a result, it has been found that even when a material having a large elastic modulus is used as the material for the region to be bonded of the second substrate 201, the above heating process can dramatically improve the bonding state (that is, dramatically improve the bonding yield) at a low pressing load.

Figure 5:
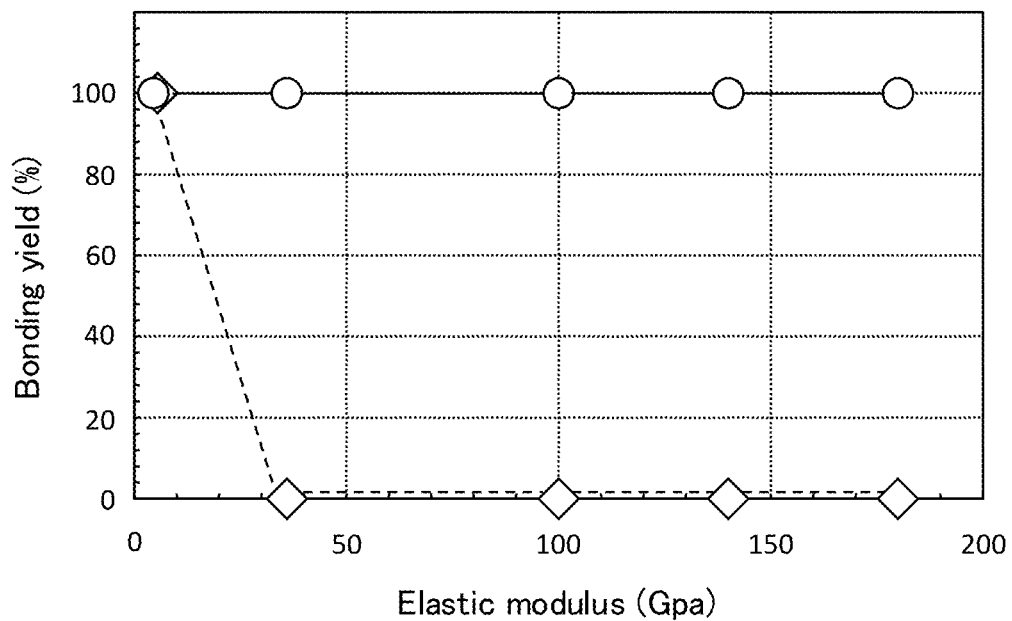
FIG. 5 shows a result of checking bonding states when the semiconductor layer islands were pressed onto a plurality of second substrates having different elastic moduli.

FIG. 5 shows a result of checking bonding states when the semiconductor layer islands 104 were pressed onto a plurality of second substrates 201 having different elastic moduli. In FIG. 5, the horizontal axis represents the elastic modulus of the materials in the region to be bonded in the second substrate 201, and the vertical axis represents the bonding yields. The bonding yield 100% corresponds to a state in which the semiconductor layer islands 104 were normally bonded to the second substrate 201, and the bonding yield 0% corresponds to a state in which the semiconductor layer islands 104 were not bonded to the second substrate 201.

Diamond markers in FIG. 5 indicate the result when no heating process was performed during the pressing, and circle markers indicate the result when the heating process was performed during the pressing. In this experiment, a group III-V compound semiconductor layer was used as a representative of the semiconductor layer. The thickness of the semiconductor layer is preferably thin, and is preferably, approximately 10 µm or less, for example. If the semiconductor layer is thick, the contact surface of the semiconductor layer becomes less likely to be in close contact with the surface of the region to be bonded of the second substrate 201. As shown in FIG. 5, it was confirmed that the heating process of the present embodiment significantly improved the bonding yield when a material having an elastic modulus greater than about 5 GPa was used as the material of the region to be bonded of the second substrate 201.

Figure 6:
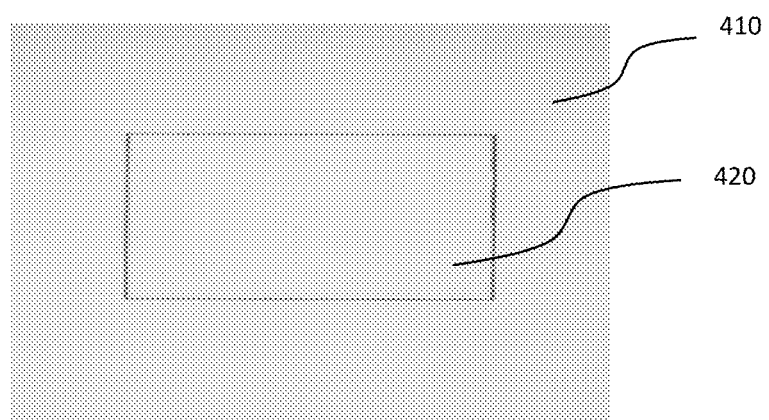
FIG. 6 is a photomicrograph showing a state in which the semiconductor layer was bonded onto a high elastic modulus material layer having an elastic modulus of about 100 GPa.

FIG. 6 is a photomicrograph showing a state in which the semiconductor layer 420 was bonded onto a high elastic modulus material layer 410 having an elastic modulus of about 100 GPa by performing the heating process during the pressing under a low load. The load applied when the semiconductor layer 420 was pressed onto the high elastic modulus material layer 410 formed on the second substrate 201 was 0.4×P0 (kg/cm$^2$). It should be noted that P0 is a conversion constant for converting a load parameter without a unit obtained by the experiment apparatus into a load with units of [kg/cm$^2$]. That is, P0 is a reference value of a magnitude corresponding to the applied load.

On the other hand, in the experiment in which the semiconductor layer 420 was pressed onto the high elastic modulus material layer 410 having an elastic modulus of about 100 GPa at room temperature, the pressed semiconductor layer 420 was detached from the high elastic modulus material layer 410 and could not be bonded onto the high elastic modulus material layer 410, even with the load 15×P0 (kg/cm$^2$). That is, it was confirmed that the heating process while the semiconductor layer 420 is being pressed onto the high elastic modulus material layer 410 can make the semiconductor layer 420 be bonded to the high elastic modulus material layer 410 having an elastic modulus of about 100 GPa by applying a load of only 1/30 or less of the load applied at room temperature.

As described above, it was confirmed that the heating process while the semiconductor layer is pressed onto the second substrate 201 can reduce the load required for bonding even if the region to be bonded in the second substrate 201 is formed of a material having a large elastic modulus. It is assumed that the heating process during the pressing caused the molecules that weaken the bonding force existing on the surface to be bonded or have little to do with bonding to desorb from the surface of the region to be bonded, whereby the semiconductor layer was easily bonded to the second substrate 201.

In addition, it is assumed that the heating process during the pressing caused an increase in the mutually attracting interaction between atoms or molecules that enhance the bonding force at the surface of the region to be bonded or atoms or molecules strongly involved in bonding, and an increase in attraction between the surfaces of the regions to be bonded, whereby the semiconductor layer was easily bonded to the second substrate 201.

Second Experiment

In the second experiment, a plurality of materials having different surface roughness were used in the region to be bonded on the second substrate 201, and bonding states were compared between (a) a case where the heating process was performed while the semiconductor layer islands 104 were pressed onto the region to be bonded of the second substrate 201 and (b) a case where no heating process was performed during the pressing.

Figure 7A:
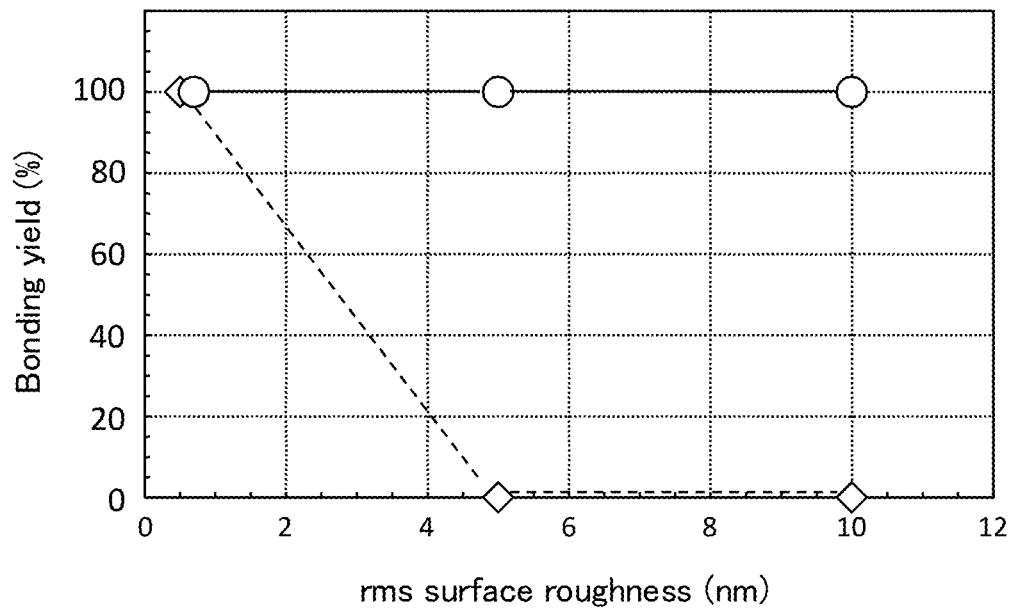
FIGS. 7A and 7B show results of checking the bonding states when the semiconductor layer islands were pressed onto a plurality of second substrates having different surface conditions.
Figure 7B:
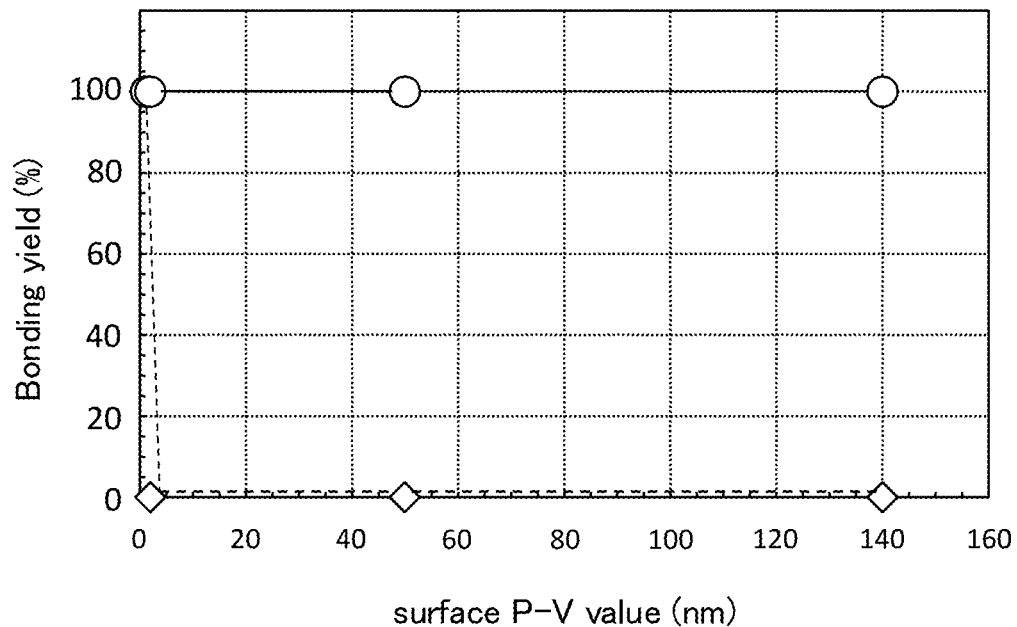

FIG. 7 shows a result of checking the bonding states when the semiconductor layer islands 104 were pressed onto the plurality of second substrates 201 having different surface conditions. The load applied to the semiconductor layer islands 104 was 5×P0 (kg/cm$^2$). In FIG. 7A, the horizontal axis represents the rms surface roughness, and the vertical axis represents the bonding yield. In FIG. 7B, the horizontal axis represents the surface P-V value, and the vertical axis represents the bonding yield. Similarly to FIG. 5, the diamond markers indicate the result when no heating process was performed, and the circle markers indicate the result when the heating process was performed.

As shown in FIGS. 7A and 7B, it was confirmed that the heating process during the pressing allowed the bonding yield to be approximately 100% and enabled a favorable bonding, even in the case of a rough surface where the rms roughness of the surface of the region to be bonded was greater than 1 nm and up to 10 nm, and where the P-V value was greater than 10 nm and up to 140 nm.

On the other hand, in the case where the pressing was performed at room temperature, the semiconductor layer islands 104 were detached from the region to be bonded, and the semiconductor layer islands 104 could not be bonded to the region to be bonded, even with the load of 15×P0 (kg/cm$^2$). In other words, it was confirmed that the heating process during the pressing allowed the magnitude of the load applied for bonding to be at least ⅓ or less of the load required for bonding at room temperature.

Third Experiment

FIG. 8 shows the bonding states in a case where the semiconductor layer was pressed onto the region to be bonded formed of a material having a predetermined elastic modulus and rms roughness with different loads. The circle markers (O) in FIG. 8 indicate results obtained when the heating process was performed during the pressing. The broken lines shown in FIG. 8 are obtained by extrapolating experimental data indicated by the circle markers (O). The horizontal axis of FIG. 8 represents the load parameter, and is a value obtained by dividing the load applied when the semiconductor layer was pressed onto the semiconductor layer by the conversion coefficient P0.

Figure 8A:
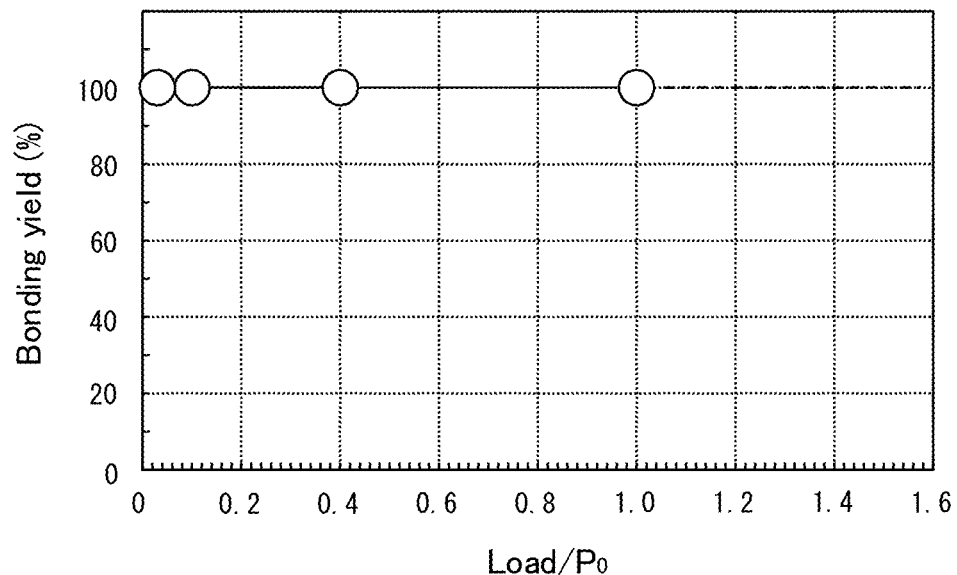
FIGS. 8A and 8B show the bonding states in cases where the semiconductor layer was pressed onto the region to be bonded formed of a material having a predetermined elastic modulus and rms roughness with different loads.
Figure 8B:
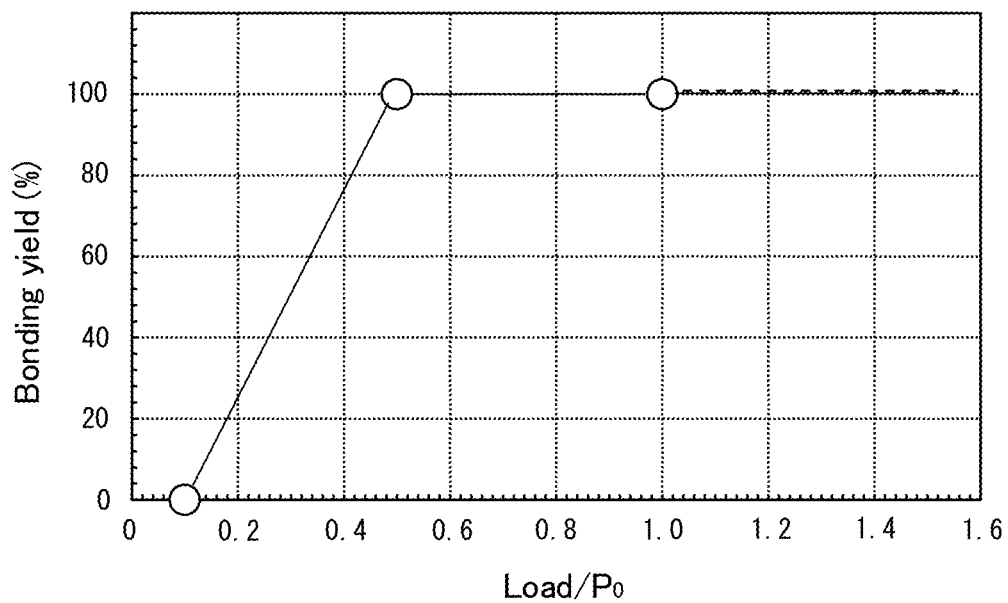

FIG. 8A shows a result when the elastic modulus of the material of the region to be bonded of the second substrate 201 was about 100 GPa and the rms roughness was about 1 nm, and the applied load was able to be reduced to 0.03×P0 (kg/cm²). This magnitude of the load is 1/100 or less of the load applied in the experiment shown in FIG. 7. FIG. 8B shows a result when the elastic modulus of the material of the region to be bonded of the second substrate 201 was about 180 GPa and the rms roughness was about 10 nm, and the applied load was able to be reduced to 0.5×P0 (kg/cm²). This magnitude of the load is 1/10 of the load applied in the experiment shown in FIG. 7.

[First Variation of Pick-Up Substrate]

The above description has illustrated a case where the semiconductor layer islands 104 are separated from the first substrate 101 by the pick-up substrate 113 having the organic material layer 111, but the semiconductor layer 103 may be separated by a means using vacuum suction, suction using electromagnetic, or the like.

Figure 9:
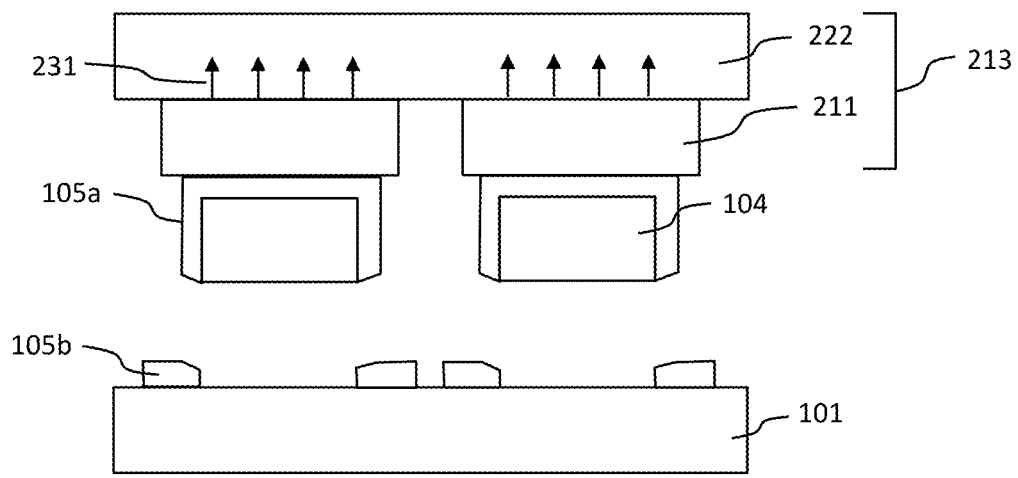
FIG. 9 illustrates a method for separating the semiconductor layer islands from the first substrate by vacuum suction.

FIG. 9 illustrates a method for separating the semiconductor layer islands 104 from the first substrate 101 by vacuum suction. A pick-up substrate 213 shown in FIG. 9 includes a material jig 211 and a suction jig 222. The material jig 211 includes at least an organic material on its surface. The suction jig 222 is a jig provided with a suction means such as vacuum suction. Arrows 231 in FIG. 9 indicate a direction in which air flows for the suction. By using such a pick-up substrate 213, the semiconductor layer islands 104 can be separated from the first substrate 101 by suctioning the semiconductor layer islands 104 with the suction jig 222 after the organic material on the surface of the material jig 211 is brought into close contact with the semiconductor layer islands 104.

In addition, the above description has illustrated a case where the fixing layer 105 is formed in order to fix the semiconductor layer islands 104 to the first substrate 101, but the manufacturing method according to the present embodiment can be applied even when no fixing layer 105 is formed.

[Second Variation of Pick-Up Substrate]

Figure 10:
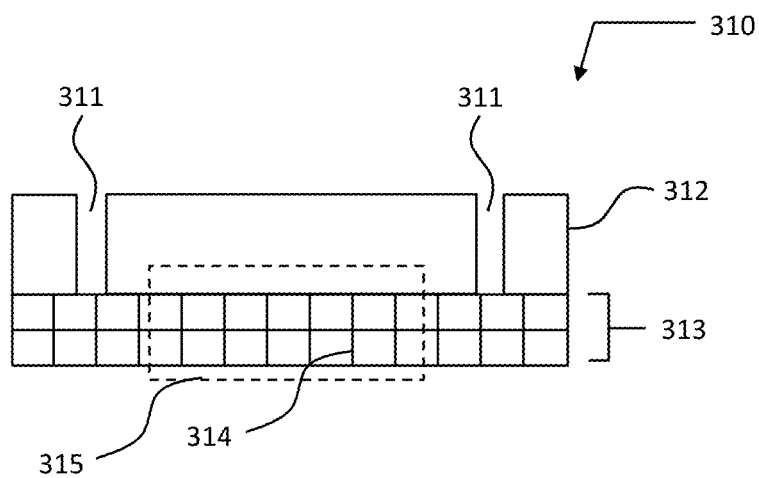
FIG. 10 shows a configuration example of a pick-up substrate according to a variation.

FIG. 10 shows a configuration example of a pick-up substrate 310 according to the present variation. As shown in FIG. 10, the pick-up substrate 310 is a jig that includes a suction substrate 312 with air suction holes 311 formed therein and a suction layer 313. The air suction hole 311 is a path through which air is suctioned.

The suction layer 313 is formed of, for example, a fibrous material or a porous material, and minute holes 314 having an inner diameter smaller than the thickness of the semiconductor layer are formed therein. The porous material is a cellulose porous body or a nanocellulose porous body, for example. Although holes exist irregularly in the cellulose porous body and the nanocellulose porous body, the positions of the fine holes are illustrated linearly in FIG. 10. The broken line in FIG. 10 indicates a region to be attracted 315, which is a region for suctioning the semiconductor layer islands 104.

In the present variation, the semiconductor layer islands 104 are vacuum-suctioned by the pick-up substrate 310 having the porous material in which the holes 314 with minute diameters are formed, and the suctioning state is kept in (a) the process of separating the semiconductor layer islands 104 from the first substrate 101 and (b) the process of bonding the semiconductor layer islands 104 to the second substrate 201.

Since the semiconductor layer is only a few μm thick, if the holes 314 formed in the porous material on the pickup substrate 310 are large or the surface irregularities are large, the load applied to the semiconductor layer islands 104 may be uneven due to the holes 314 or the surface irregularities, which may result in cracks in the semiconductor layer. Further, there is also a risk that the magnitude of the load may be different between the positions of the holes 314 and the positions other than the holes 314, or that there may be a position where no load is applied, resulting in poor bonding. In addition, there is also a risk of cracks in the semiconductor layer due to a large suction force at the positions of the holes 314 during the vacuum suction. From these viewpoints, the holes 314 formed in the suction layer 313 of the pick-up substrate 310 used for vacuum-suctioning the semiconductor layer islands 104 have sufficiently small diameters, and the surface irregularities of the suction layer 313 are sufficiently small. The inner diameters of the holes 314 formed in the suction layer 313 are preferably smaller than the thickness of the semiconductor layer, for example.

The cross-sectional areas of the air suction holes 311 is larger than the cross-sectional areas of the fine holes 314 formed in the suction layer 313, for example. If the suction layer 313 is thin and easy to deform, the air suction holes 311 should be located outside of the region to be attracted 315. The air suction holes 311 are configured in such a way that the force generated by suctioning air is not directly applied to an area corresponding to the region to be attracted 315 in the suction layer 313. Therefore, the area deformation of the suction layer 313 corresponding to the region to be attracted 315 can be suppressed. If the deformation of the suction layer 313 does not affect the suction of the semiconductor layer islands 104 and the application of the load to the semiconductor layer islands 104, the air suction holes 311 may be configured to be located within the region to be attracted 315 in the semiconductor layer islands 104.

With the pick-up substrate 310 as shown in FIG. 10, the semiconductor layer islands 104 can be separated from the first substrate 101, and the separated semiconductor layer islands 104 can be bonded to the second substrate 201, through the following procedure. First, the semiconductor layer islands 104 are separated from the first substrate 101 by suctioning air from the air suction holes 311 while the suction layer 313 is in contact with the semiconductor layer islands 104. Specifically, as shown in FIG. 1E, the fixing layer 105 and the semiconductor layer islands 104 are attracted by the pick-up substrate 310 in a state where the voids 106 are formed on the lower surface of the semiconductor layer islands 104. After the semiconductor layer islands 104 are attracted, the semiconductor layer islands 104 are separated from the first substrate 101 by moving the pick-up substrate 310 in a direction such that the fixing layer 105 breaks at portions of the voids 106.

Next, the semiconductor layer islands 104 are pressed onto the region to be bonded of the second substrate 201. Prior to the process of pressing the semiconductor layer islands 104 onto the second substrate 201, surface treatment such as the plasma treatment may be performed on the bonding surfaces of the regions to be bonded of the semiconductor layer islands 104 and the second substrate 201. When performing the plasma treatment, atmospheric pressure plasma may be used, for example.

If the elastic modulus of the material of the region to be bonded of the second substrate 201 is greater than 5 GPa, if the rms surface roughness is greater than 1 nm, or if the surface P-V value is greater than 10 nm, one or both of the second substrate 201 and the pick-up substrate 310 are heated to a temperature in the range of about 80° C. to 150° C. The pick-up substrate 310 is separated from the semiconductor layer islands 104 by stopping the suction operation by the pick-up substrate 310 after the pressing state is maintained for an appropriate time.

In the manufacturing method according to the present variation, the pick-up substrate 310 attracts the semiconductor layer islands 104, separates the semiconductor layer islands 104 from the first substrate 101, and bonds the semiconductor layer islands 104 to the second substrate 201, with the pick-up substrate 310 including the suction layer 313 with the minute holes 314 having inner diameters smaller than at least the thickness of the semiconductor layer (more preferably, on the order of nanometers or less). In this way, it is possible to apply a suction force and a pressing force with little variation to the surface of the semiconductor layer, preventing defects such as cracks from occurring on the semiconductor layer islands 104.

It should be noted that the suction layer 313 in contact with the semiconductor layer islands 104 may be formed of an organic material layer with micropores and channels for gas to flow through. Further, the suction layer 313 may be made of Si, glass, or ceramic material in which minute through holes or channels for gas to flow through are formed. In addition, the suction layer 313 may be formed with a bump shape. Alternatively, the pick-up substrate 310 may include a plurality of bump-shaped suction layers 313 that simultaneously suction the plurality of semiconductor layer islands 104 to separate the plurality of semiconductor layer islands 104 from the first substrate 101.

[Other Variations]

FIGS. 1 and 2 have illustrated that two regions to be bonded are provided on the second substrate 201, and two semiconductor layer islands 104 are bonded to the second substrate 201, but the number of semiconductor layer islands 104 bonded to the second substrate 201 is arbitrary. When the plurality of semiconductor layer islands 104 are bonded to the second substrate 201, the efficiency of the bonding process can be improved by simultaneously pressing the plurality of semiconductor layer islands 104 onto the second substrate 201 in a state where the temperature of the second substrate 201 or the pick-up substrate 113 is maintained at a temperature higher than room temperature.

Alternatively, the plurality of semiconductor layer islands 104 may be pressed onto the second substrate 201 by repeating the process of pressing the one semiconductor layer island 104 onto the second substrate 201 while the temperature of the second substrate 201 or the pick-up substrate 113 is maintained at the temperature higher than room temperature. In this case, the pick-up substrate 113 can be miniaturized since the pick-up substrate 113 does not need to attract the plurality of semiconductor layer islands 104 at the same time, and so the pick-up substrate 113 and the semiconductor layer island 104 can be easily separated from each other in the second separation process.

In addition, the above description has illustrated the case where the semiconductor layer 103 is formed on the sacrificial layer 102 provided on the first substrate 101, and the semiconductor layer islands 104 are separated from the first substrate 101 by selectively etching the sacrificial layer 102. But the semiconductor layer islands 104 may be separated from the first substrate 101, depending on a combination of the material of the semiconductor layer 103 and the material of the first substrate 101, by using anisotropic etching of the surface of the first substrate 101 without providing the sacrificial layer 102. Alternatively, the semiconductor layer islands 104 may be separated from the first substrate 101 by providing a material layer (for example, graphene) which is easily separated in a layered manner between the semiconductor layer 103 and the first substrate 101.

Effect of Manufacturing Method of the Present Embodiment

As described above, performing the heating to raise the temperatures of the bonding surfaces while the semiconductor layer islands 104 are pressed onto the second substrate 201 allows the load required for the bonding to be smaller than in a conventional method, even when the material of the region to be bonded of the second substrate 201 is hard and difficult to deform, or even when the surface roughness of the region to be bonded on the second substrate 201 is large. As a result, large deformation caused by the organic material layer 111 of the pick-up substrate 113 being pressed hard against the semiconductor layer island 104 can be suppressed. In addition, the organic material layer 111 can be prevented from being fixed to the semiconductor layer islands 104, and the organic material layer 111 can be prevented from being fixed to the second substrate 201 outside the semiconductor layer islands 104.

Further, since the load applied at the time of the pressing is small, it is possible to prevent the deviation from the position to be bonded and the occurrence of contamination around the bonded semiconductor layer. Furthermore, even if the total area of the semiconductor layer to be bonded is large, the total load can be reduced. It should be noted that, in the case where a material having an elastic modulus smaller than 5 GPa (for example, an organic material such as PET or PI) is provided in the region to be bonded of the second substrate 201, the load for pressing the semiconductor layer islands 104 onto the region to be bonded on the second substrate 201 can be further reduced as compared with the case where bonding is performed at room temperature.

The present invention is explained on the basis of the exemplary embodiments. The technical scope of the present invention is not limited to the scope explained in the above embodiments and it is possible to make various changes and modifications within the scope of the invention. For example, the specific embodiments of the distribution and integration of the apparatus are not limited to the above embodiments, all or part thereof, can be configured with any unit which is functionally or physically dispersed or integrated. Further, new exemplary embodiments generated by arbitrary combinations of them are included in the exemplary embodiments of the present invention. Further, effects of the new exemplary embodiments brought by the combinations also have the effects of the original exemplary embodiments.

What is claimed is:

1. A method for manufacturing a semiconductor device by separating a plurality of semiconductor layer islands formed on a first substrate from the first substrate and bonding the plurality of semiconductor layer islands to a second substrate different from the first substrate, the method comprising the steps of:
a first separation process of separating a first semiconductor layer island of the plurality of semiconductor layer islands from the first substrate by bringing a pick-up substrate into close contact with the first semiconductor layer island included in the plurality of semiconductor layer islands and then moving the pick-up substrate away from the first substrate;
pressing of pressing the first semiconductor layer island to the second substrate by applying a load, to the first semiconductor layer island, which is (a) smaller than a load required to bond the first semiconductor layer island to the second substrate by pressing the first semiconductor layer island onto the second substrate at room temperature and which is (b) large enough to prevent portions of the pick-up substrate from being fixed to an outside of the first semiconductor layer island, with temperatures of contact surfaces of the first semiconductor layer island and the second substrate maintained at a temperature higher than room temperature;
temperature maintenance of maintaining temperatures of contact surfaces of the first semiconductor layer island and the second substrate at a temperature between 80° C. and 150° C. while pressing the first semiconductor layer island onto the second substrate; and
a second separation process of separating the first semiconductor layer island from the pick-up substrate after the temperatures of the contact surfaces are maintained at the temperature between 80° C. and 150° C., wherein
the second separation process further comprises:
stop the temperature maintenance after a predetermined time;
stop applying the load of pressing;
separating the first semiconductor layer island from the pick-up substrate by chemically or mechanically or in a combination thereof; and wherein
after the second separation process for the first semiconductor layer island, the first separation process to the second separation process are performed on a second semiconductor layer island different from the first semiconductor layer island among the plurality of semiconductor layer islands.

2. The method for manufacturing a semiconductor device according to claim 1, further comprising the step of:
heating at least one of the second substrate and the pick-up substrate while the pressing is performed.

3. The method for manufacturing a semiconductor device according to claim 2, further comprising the step of:
acquiring information indicating a material, a thickness, or a surface state of the second substrate or the plurality of semiconductor layer islands, prior to the heating, wherein
the heating heats at least one of the second substrate and the pick-up substrate by a heating amount determined on the basis of at least one of the material, the thickness, or the surface state of the second substrate or the plurality of semiconductor layer islands.

4. The method for manufacturing a semiconductor device according to claim 1, wherein
the heating of at least one of the second substrate and the pick-up substrate is started before starting the pressing.

5. The method for manufacturing a semiconductor device according to claim 1, wherein
the first separation process includes separating a plurality of the first semiconductor layer islands from the first substrate; and
the temperature maintenance includes heating regions including at least regions corresponding to the plurality of the first semiconductor layer islands that are in close contact with the pick-up substrate.

6. The method for manufacturing a semiconductor device according to claim 1, wherein
the pressing includes applying a load to the pick-up substrate toward the second substrate; and
the second separation process includes stopping application of the load to the pick-up substrate.

7. The method for manufacturing a semiconductor device according to claim 6, wherein
an organic material is provided on a surface of the pick-up substrate pressed onto the first semiconductor layer island, and
the pressing includes applying a load smaller than a load at which the organic material is plastically deformed.

8. The method for manufacturing a semiconductor device according to claim 1, wherein
an elastic modulus of a material of a region to be bonded, to which the first semiconductor layer island is to be pressed in the second substrate, is greater than 5 GPa.

9. The method for manufacturing a semiconductor device according to claim 1, wherein
the second substrate has an rms surface roughness of 1 nm or more or a P-V value of 10 nm or more on a surface of a region to be bonded, to which the first semiconductor layer island is to be pressed.

10. The method for manufacturing a semiconductor device according to claim 1, wherein
the first separation process includes bringing the pick-up substrate with holes having inner diameters smaller than a thickness of the first semiconductor layer island into close contact with the first semiconductor layer island.

11. The method for manufacturing a semiconductor device according to claim 10, wherein
the first separation process includes bringing the pick-up substrate, having a surface including a cellulose porous body or a nanocellulose porous body to be in contact with the first semiconductor layer island, into close contact with the first semiconductor layer island.

12. The method for manufacturing a semiconductor device according to claim 1, wherein
the pick-up substrate includes (a) a suction substrate in which air suction holes for suctioning air are formed and (b) a suction layer provided on the suction substrate in which holes having inner diameters smaller than the thickness of the first semiconductor layer island are formed, and
the first separation process includes separating the first semiconductor layer island from the first substrate by suctioning air through the air suction holes while the suction layer is in contact with the semiconductor layer.

13. A method for manufacturing a semiconductor device by separating a plurality of semiconductor layer islands formed on a first substrate from the first substrate and bonding the plurality of semiconductor layer islands to a second substrate different from the first substrate, the method comprising the steps of:
- a first separation process of separating a first semiconductor layer island of the plurality of semiconductor layer islands from the first substrate by bringing an organic material layer included in a pick-up substrate into close contact with the first semiconductor layer island included in the plurality of semiconductor layer islands and then moving the pick-up substrate in a direction away from the first substrate;
- pressing of pressing the first semiconductor layer island onto the second substrate by applying a load, to the first semiconductor layer island, which is smaller than a load at which the organic material layer is plastically deformed, in a state where temperatures of contact surfaces of the first semiconductor layer island and the second substrate are maintained at a temperature higher than room temperature;
- temperature maintenance of maintaining the temperatures of the contact surfaces of the first semiconductor layer island and the second substrate at the temperature between 80° C. and 150° C. while pressing the first semiconductor layer island onto the second substrate;
- a second separation process of separating the first semiconductor layer island from the pick-up substrate after the temperatures of the contact surfaces are maintained at the temperature between 80° C. and 150° C., wherein the second separation process further comprises:
- stop the temperature maintenance after a predetermined time;
- stop applying the load of pressing;
- separating the first semiconductor layer island from the pick-up substrate by chemically or mechanically or in a combination thereof; and wherein
- after the second separation process for the first semiconductor layer island, the first separation process to the second separation process are performed on a second semiconductor layer island different from the first semiconductor layer island among the plurality of semiconductor layer islands.

* * * * *